(12) United States Patent
Hariya et al.

(10) Patent No.: US 6,727,898 B2
(45) Date of Patent: *Apr. 27, 2004

(54) NUMERICAL ANALYSIS MESH GENERATING METHOD AND APPARATUS

(75) Inventors: Masayuki Hariya, Ibaraki-ken (JP); Ichiro Nishigaki, Ishioka (JP); Chie Takizawa, Ibaraki-ken (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/251,858

(22) Filed: Sep. 23, 2002

(65) Prior Publication Data

US 2003/0016216 A1 Jan. 23, 2003

Related U.S. Application Data

(63) Continuation of application No. 09/443,103, filed on Nov. 18, 1999.

(51) Int. Cl.[7] .............................................. G06T 17/00
(52) U.S. Cl. ..................... 345/420; 345/423; 345/581; 345/421
(58) Field of Search ................................ 345/419, 423, 345/581, 421, 420

(56) References Cited

U.S. PATENT DOCUMENTS 5,892,515 A * 4/1999 Kobayashi et al. ......... 345/423
5,946,479 A * 8/1999 Sakaguchi et al. ............ 716/20
6,285,372 B1   9/2001 Cowsar et al.
6,535,211 B1 * 3/2003 Hariya et al. ............... 345/423

FOREIGN PATENT DOCUMENTS

| JP | 474280 | 3/1992 |
| JP | 668217 | 3/1994 |
| JP | 8212240 | 8/1996 |

OTHER PUBLICATIONS

Chiba, et al "A flexible automatic hexahedral mesh generation by boundary-fit method", publisher: Computer methods in applied mechanics and engineering, published Oct. 2, 1997, pp. 145–154.

* cited by examiner

Primary Examiner—Mark Zimmerman
Assistant Examiner—Kimbinh T. Nguyen
(74) Attorney, Agent, or Firm—Antonelli, Terry, Stout & Kraus, LLP

(57) ABSTRACT

A numerical analysis mesh generating method, wherein a geometric model under analysis is inputted, a verification model having the geometry analogous to the geometric model is selected, the geometric model is corresponded to the verification model in terms of the geometry, a previously created mapping model approximated from the verification model with a lattice is read, the mapping model of the verification model is modified from a geometric correspondence between the geometric model and the verification model to create a mapping model for the geometric model, and lattice points in the created mapping model for the geometric model are mapped to the geometric model to create a numerical analysis mesh.

8 Claims, 19 Drawing Sheets

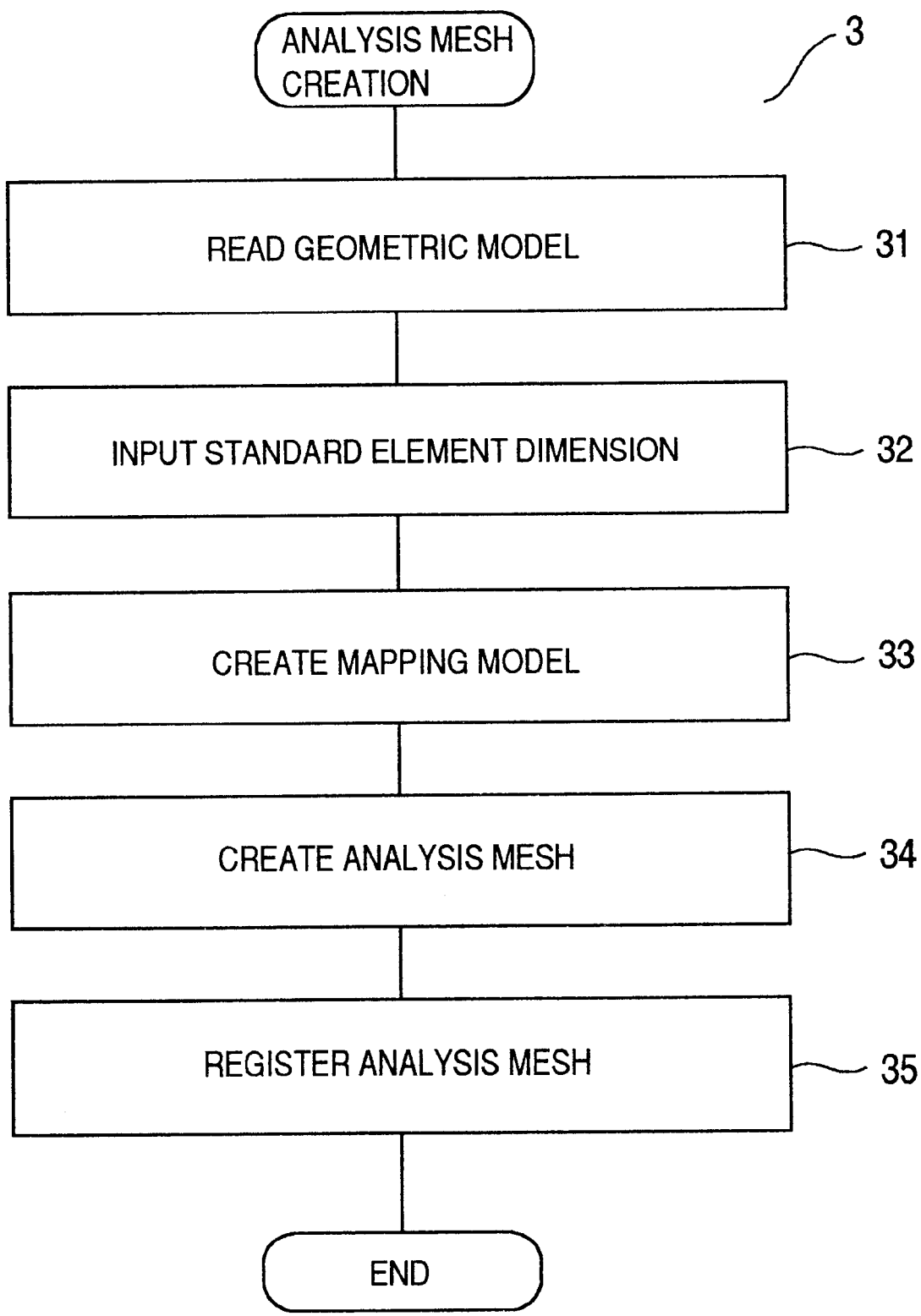

GEOMETRIC MODEL

MAPPING MODEL

ANALYSIS MESH

FIG.5

EDGE DATA                                               62

| EDGE NUMBER (EDGE IDENTIFIER) | ASSIGNED DIRECTION IN MAPPING MODEL | DIVISION NUMBER IN MAPPING MODEL |
|---|---|---|
| 1 | $+\xi$ | 3 |
| 2 | $+\eta$ | 2 |
| 3 | $-\xi$ | 2 |
| 4 | $+\eta$ | 2 |
| 5 | | |

FACE DATA

| FACE NUMBER (FACE IDENTIFIER) | ASSIGNED DIRECTION IN MAPPING MODEL |
|---|---|
| 1 | $+\xi$ |
| 2 | $+\eta$ |
| 3 | $-\xi$ |
| 4 | $+\eta$ |
| 5 | |

FIG.6

NODE DATA

| TOTAL NUMBER OF NODES | 20 | | |
|---|---|---|---|
| NODE NUMBER | x - COORDINATE VALUE | y - COORDINATE VALUE | z - COORDINATE VALUE |
| 1 | 0.0 | 0.0 | 0.0 |
| 2 | 5.0 | 0.0 | 0.0 |
| 3 | 0.0 | | |

ELEMENT DATA

| TOTAL NUMBER OF ELEMENTS | 20 |
|---|---|
| ELEMENT NUMBER | ELEMENT - CONSTITUENT NODE NUMBERS |
| 1 | 1 , 2 , 3 , 4 , 5 , 6 , 7 , 8 |
| 2 | 2 , 9 , 10 , 3 , 6 , 11 , 12 , 7 |
| 3 | |

FIG.9

CORRESPONDENCE TABLE

| MODEL UNDER ANALYSIS EDGE NUMBER | VERIFICATION MODEL EDGE NUMBER |
|---|---|
| 1 | 1 |
| 2 | 2 |
| 3 | NO_RELATION ← 901 |
| 4 | |

| MODEL UNDER ANALYSIS FACE NUMBER | VERIFICATION MODEL FACE NUMBER |
|---|---|
| 1 | 1 |
| 2 | 2 |
| 3 | 3 |
| 4 | |

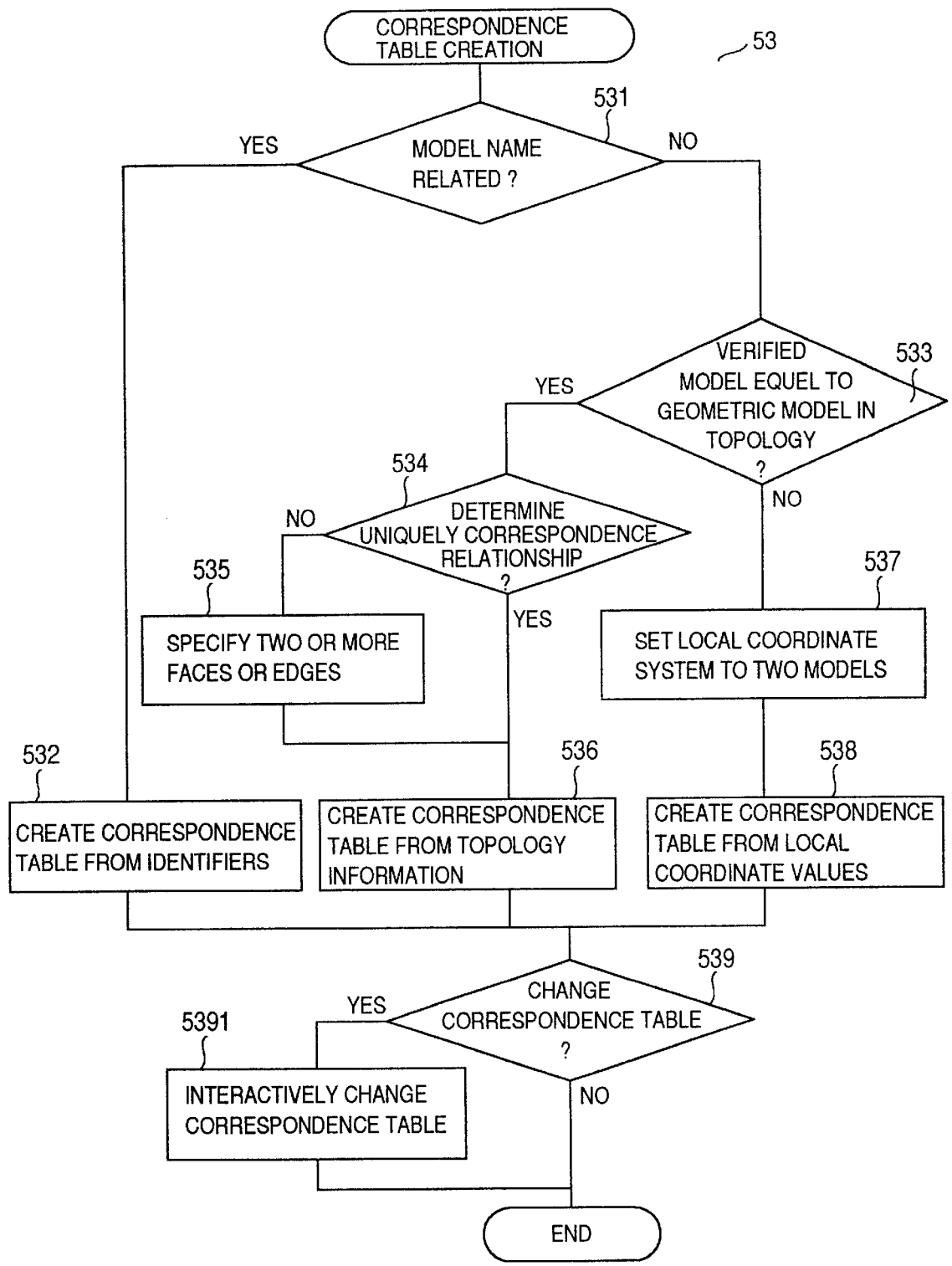

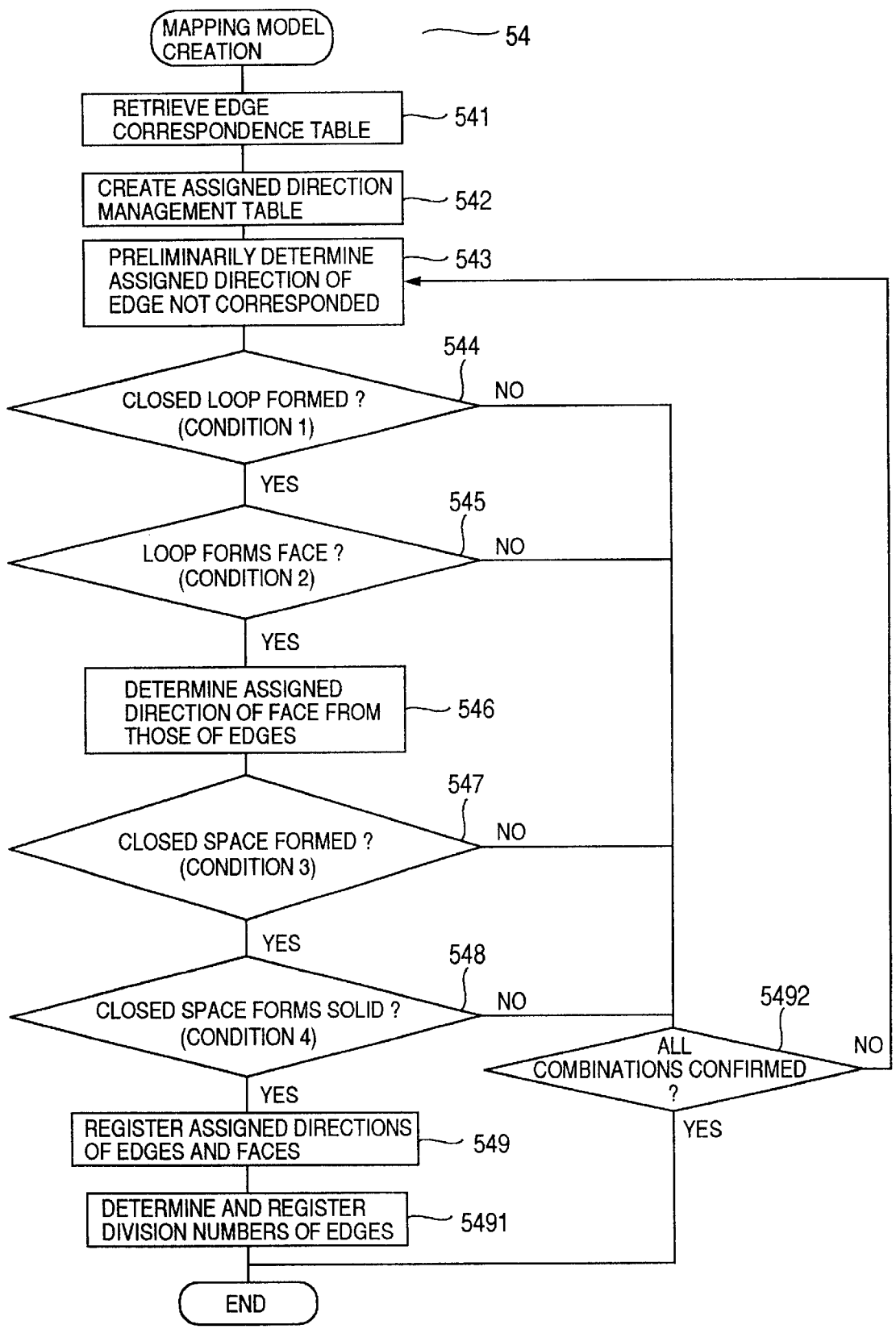

FIG.12A

ASSIGNED DIRECTION MANAGEMENT TABLE PRELIMINARY DECISION 1

| DIRECTION \ EDGE NUMBER | 1 | 2 | 3 | 4 | 5 |
|---|---|---|---|---|---|
| $\zeta+$ | ○ |  | △ | △ |  |
| $\zeta-$ |  | ○ |  |  | ○ |
| $\xi+$ |  |  |  |  |  |
| $\xi-$ |  |  |  |  |  |
| $\eta+$ |  |  |  |  |  |
| $\eta-$ |  |  |  |  |  |

FIG.12B

ASSIGNED DIRECTION MANAGEMENT TABLE PRELIMINARY DECISION 2

| DIRECTION \ EDGE NUMBER | 1 | 2 | 3 | 4 | 5 |
|---|---|---|---|---|---|
| $\zeta+$ | ○ |  |  | △ |  |
| $\zeta-$ |  | ○ | △ |  | ○ |
| $\xi+$ |  |  |  |  |  |
| $\xi-$ |  |  |  |  |  |
| $\eta+$ |  |  |  |  |  |
| $\eta-$ |  |  |  |  |  |

US 6,727,898 B2

NUMERICAL ANALYSIS MESH GENERATING METHOD AND APPARATUS

This is a continuation of application Ser. No. 09/443,103, filed Nov. 18, 1999.

BACKGROUND OF THE INVENTION

The present invention relates to a numerical analysis mesh generating method and apparatus for a CAE (Computer Aided Engineering) system which relies on a computer-based numerical simulation to optimize and rationalize design works, and more particular to a method for readily generating an analysis mesh when a geometric model under analysis has been changed.

As conventional techniques for readily creating an analysis mesh when a three-dimensional geometric model under analysis has been changed, there are following methods.

JP-A-4-074280 shows a method (first method) which reads a numerical analysis mesh registered in a previously created model file, receives a correspondence relationship, specified by a system user between nodes of boundaries on the numerical analysis mesh and constituent points of a geometric model for which a mesh is newly created, and creates nodes internal to the geometry to create an analysis mesh.

JP-A-6-068217 shows a method (second method) which references geometry-to-mesh correspondence data when the dimension of a feature such as the width of the feature, the diameter of a hole, or the like is changed in a geometric model under analysis, and uses a coordinate conversion matrix from a coordinate system for the geometric model before the feature is changed to a coordinate system after the feature is changed to modify an analysis mesh for the portion subjected to the changed feature, and then smooth node coordinate values to create an analysis mesh.

JP-A-8-212240 shows a method (third method) which, when a hole feature is added due to a design change, previously creates an analysis mesh for the hole portion, moves the analysis mesh for the hole portion to a location at which a modification is desired in the previously created analysis mesh, and collectively calculates differences between the previously created analysis mesh and the analysis mesh for the hole portion to create an analysis mesh.

U.S. Pat. No. 5,892,515 in turn shows a method which creates a mapping model from a geometric model to create an analysis mesh.

The above-mentioned prior art methods for creating an analysis mesh when a geometric model under analysis is changed have the following problems.

The first and second methods, although having the ability of supporting a design change such as a change in dimension of a feature, cannot create an analysis mesh when a design change involves a different topological relationship such as a connection between edges, a connection between surfaces or the like of a geometric model.

The first method also requires the system user to specify a correspondence relationship between nodes of boundaries in a numerical analysis mesh and constituent points in a geometrical model for which a mesh is newly created, thereby resulting in an increased number of mesh creation steps.

The third method requires the system user to interactively place the mesh for the hole portion on the previously created geometric model, and may result in creating a mesh which has an undesirable feature from a viewpoint of analysis depending on a positional relationship between the previously created mesh and the mesh for the hole portion, due to the collective calculation of the differences between the previously created analysis mesh and the analysis mesh for the hole portion.

SUMMARY OF THE INVENTION

It is an object of the present invention to provide a numerical analysis mesh generating method and apparatus which are capable of efficiently creating a high quality hexahedral mesh for highly accurate analysis and reducing a total calculation cost. More particularly, it is an object of the present invention to provide a numerical analysis mesh generating method and apparatus which are capable of readily creating a high quality analysis mesh when a geometric model under analysis is changed in a mesh generating method using a mapping approach.

To achieve the above object, the present invention provides a numerical analysis mesh generating method comprising the steps of inputting a geometric model under analysis, selecting a verification model having the geometry analogous to the geometric model, corresponding the geometric model to the verification model in terms of the geometry, reading a previously created mapping model approximated from the verification model with a lattice, modifying the mapping model of the verification model using a geometric correspondence between the geometric model and the verification model to create a mapping model for the geometric model, and mapping lattice points in the created mapping model for the geometric model to the geometric model to create a numerical analysis mesh.

BRIEF DESCRIPTION OF THE DRAWINGS

FIG. 3 is a flow chart illustrating a processing procedure for creating an analysis mesh using a mapping approach;

FIG. 5 is a diagram showing an example of a mapping model data structure;

FIG. 6 is a diagram showing an example of an analysis mesh data structure;

FIG. 9 is a diagram showing an example of an edge correspondence table/face correspondence table;

FIG. 10 is a flow chart illustrating in detail a processing procedure for creating a correspondence table;

FIG. 11 is a flow chart illustrating in detail a processing procedure for creating a mapping model in the model verifier;

FIGS. 12A, 12B respectively show an example of an assigned direction management table;

Figure 1:
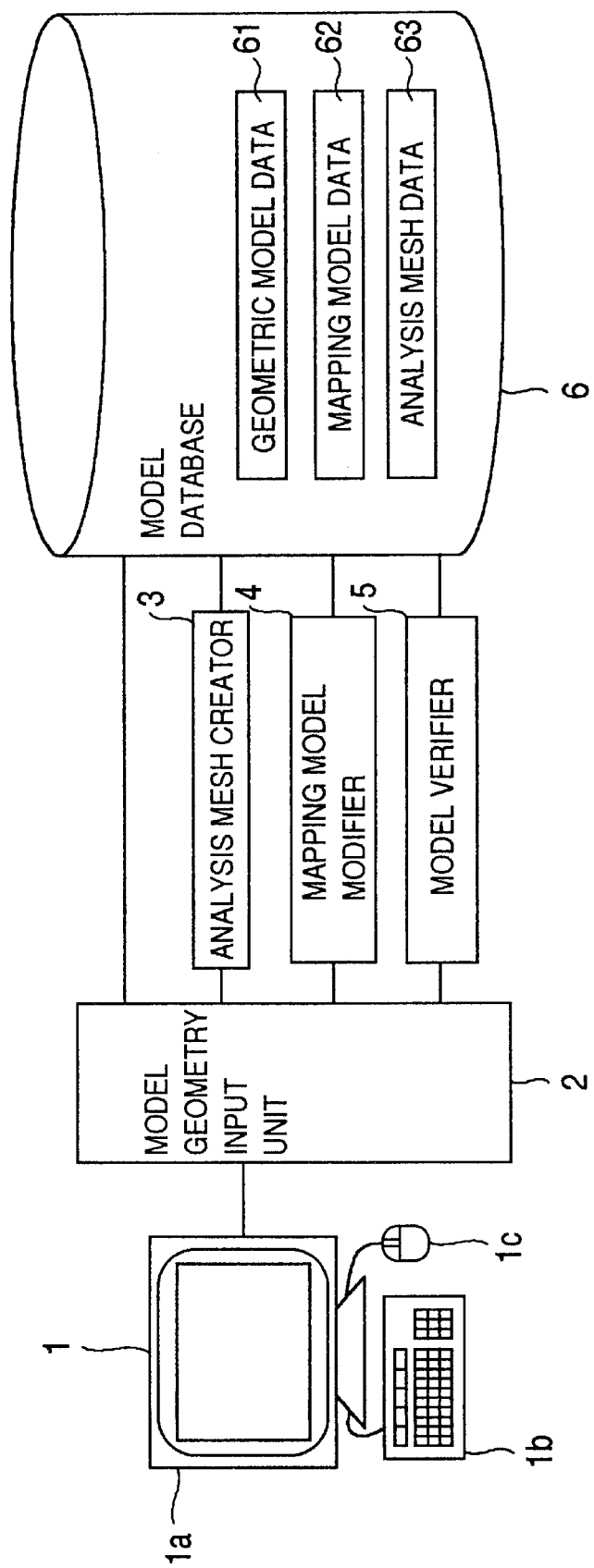
FIG. 1 is a block diagram illustrating the configuration of an embodiment of a numerical analysis mesh generating apparatus according to the present invention.

DESCRIPTION OF THE EMBODIMENTS (1) Configuration:

FIG. 1 is a block diagram illustrating the configuration of an embodiment of a numerical analysis mesh generating apparatus according to the present invention. The numerical analysis mesh generating apparatus of this embodiment comprises an input/output device 1; a model geometry input unit 2; an analysis mesh creator 3; a mapping model modifier 4; a model verifier 5; and a model database 6.

The mesh generating apparatus is a computer system such as a workstation, a personal computer or the like which comprises a main memory, a CPU, an auxiliary memory, a display, a keyboard, a mouse, and so on. The input/output device 1 is implemented by a display, a keyboard and a mouse. The model database 6 is stored in the auxiliary memory. The remaining model geometry input unit 2, analysis mesh creator 3, mapping model modifier 4, model verifier 5 are implemented by software programs executed by the CPU.

The model input unit 2 creates or changes geometric model data based on numerical values inputted by the user of the mesh generating apparatus using the keyboard 1b and the mouse 1c of the input/output device 1, registers it in the model database 6 as geometric model data 61, and displays it on a display 1a.

The analysis mesh creator 3 creates a mapping model which approximates a geometric model previously registered in the model database 6 with an orthogonal lattice, and registers it in the model database as mapping model data 62. Further, the analysis mesh creator 3 maps lattice points of this mapping model to the geometric model to create numerical analysis mesh data 63, and registers it in the model database 6.

The mapping model modifier 4 reads a mapping model previously registered in the model database 6, modifies a feature in this mapping model, and registers again the modified mapping model data 62 and analysis mesh data 63 in the model database 6.

The model verifier 5 verifies a geometric model and a mapping model previously registered in the model database 6 with a changed geometric model to create mapping model data 62 and numerical analysis mesh data 63 corresponding to a changed feature, and registers them in the model database 6.

Figure 2:
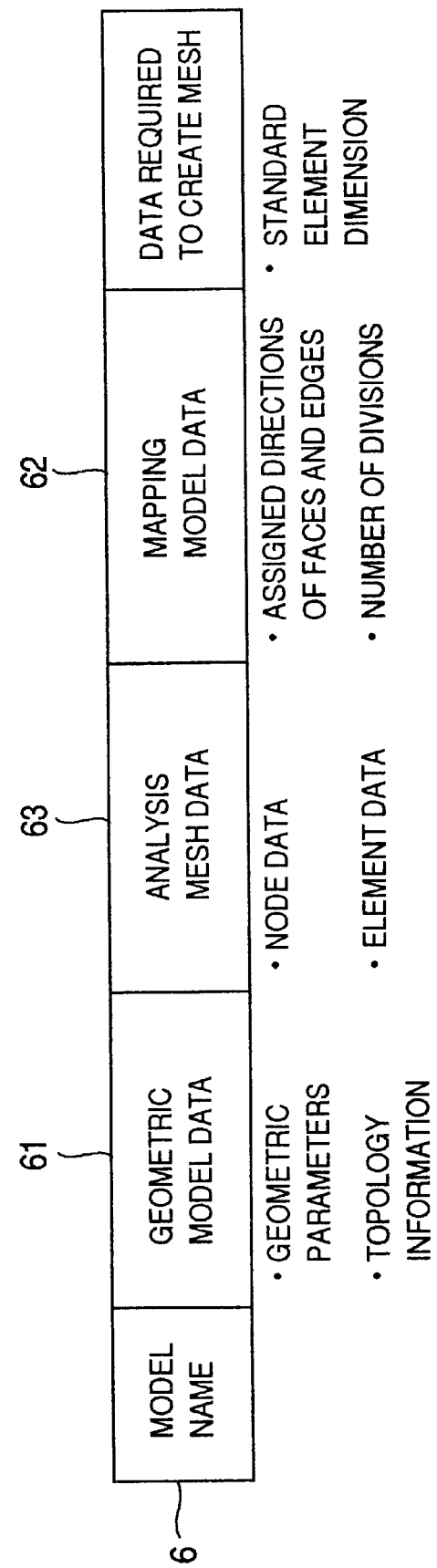
FIG. 2 is a diagram showing an example of a model data structure registered in a model database.

FIG. 2 is a diagram illustrating an example of a model data structure registered in the model database 6. The model database 6 holds a model name of a geometry; geometry model data 61; analysis mesh data 63; mapping model data 62; and other data required to create a mesh in correspondence to each model.

The geometric model data 61 is represented by topology information which represents how faces, edges and vertexes are connected to constitute the geometry; and geometric parameters representative of the shapes of faces and edges, and coordinate values of vertexes. The topology information is represented by boundary representations (B-reps) which are frequently used in CAD (computer aided design) systems. The B-reps is constructed such that a solid is composed of faces; a face is composed of edges constituting the same; and an edge has vertexes on both ends. The geometric parameters, on the other hand, are represented by use of parametric representations such as NURBS which is frequently used in CAD systems.

The mapping model data 62, as shown in FIG. 5, includes an assigned direction $\pm\xi$, $\pm\eta$, $\pm\zeta$ and a number of divisions for each of edges constituting a geometric model in a mapping space; and an assigned direction $\pm\xi$, $\pm\eta$, $\pm\zeta$ of each of faces constituting the geometric model in the mapping space.

The analysis mesh data 63, as shown in FIG. 6, includes node data which is the coordinates of a node of a mesh; and element data which represents the relationship between each hexahedron (element) of the mesh and nodes constituting the element.

Figure 4A:
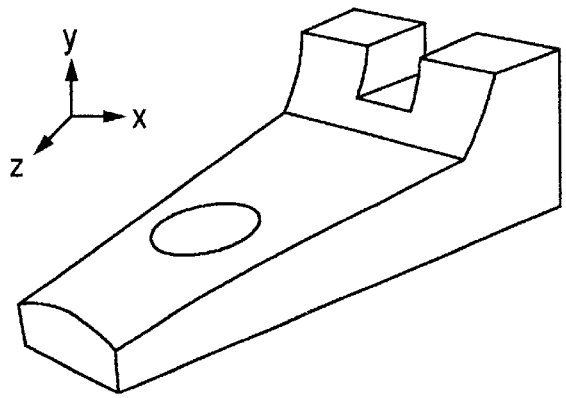
FIGS. 4A, 4B, 4C are diagrams respectively-showing an example of a geometric model, a mapping model and an analysis mesh for an object under analysis which are created during the processing procedure of FIG. 3.
Figure 4B:
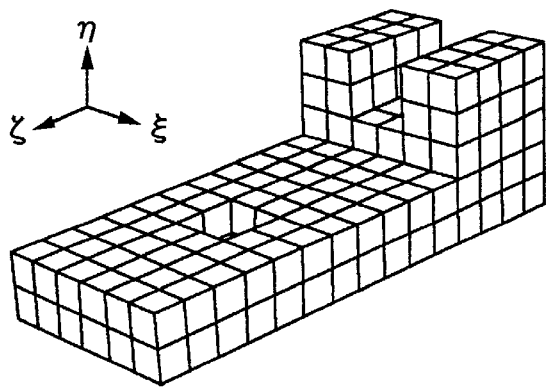
Figure 4C:
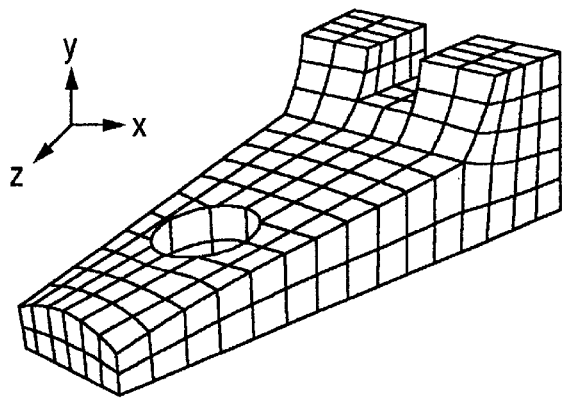

(2) Creation of Analysis Mesh:

FIG. 3 is a flow chart illustrating an example of a processing procedure for the analysis mesh creator 3 to create an analysis mesh using a mapping approach, and FIGS. 4A, 4B, and 4C are diagrams illustrating examples of a geometric model, a mapping model and an analysis mesh of an object under analysis, which are created through the processing procedure of FIG. 3.

Since a sequence of procedure steps is described in detail in the aforementioned U.S. Pat. No. 5,892,515, brief description is given hereinbelow.

Step 31: The user of the mesh generating apparatus inputs geometric model data 61 such as FIG. 4A using the keyboard 1b or the mouse 1c of the input/output device 1 or utilizing an input system of CAD. In this event, when a previously registered geometric model is reused, the registered geometric model under analysis is read from the model database 6.

Step 32: The user of the mesh generating apparatus interactively inputs a standard element dimension, which serves as the length of a side of a hexahedral element, for the read geometric model from the keyboard 1b or the mouse 1c.

Step 33: The analysis mesh creator 3 assigns each edge of each face of the geometric model under analysis of FIG. 4A in parallel with one of three orthogonal coordinate axes as shown in FIG. 4B, and creates a mapping model by dividing an approximate model topologically equal to the geometry under analysis into hexahedral lattices, based on the standard element dimension inputted by the user of the mesh generating apparatus.

Step 34: The analysis mesh creator 3 maps lattice points of the mapping model to the geometric model under analysis, as illustrated in FIG. 4C, to create an analysis mesh.

This mapping approach is referred to as a boundary fit method which is also shown in "A flexible automatic hexahedral mesh generation by boundary-fit method" (Computer methods in applied mechanics and engineering 161 (1998), pp145–154).

Step 35: The analysis mesh creator 3 registers the created mapping model and analysis mesh in the model database 6.

As described above, the mapping model data 62 is represented in the form of FIG. 5; and the analysis mesh data 63 in the form of FIG. 6.

The analysis mesh created in this way is displayed on the display in the form of FIG. 4C. When a finite element method is used to conduct an analysis, the analysis accuracy is affected by the shape of each element in the mesh. As the hexahedral element is closer to a regular hexahedral element, the accuracy is higher. Therefore, when the user modifies the displayed analysis mesh, the mapping model modifier 4 is invoked.

The mapping model modifier 4 reads mapping model data of a geometry under analysis registered in the model database 6, and displays it on the display device 1a. The user of the mesh generating apparatus interactively moves points, edges and faces of the displayed mapping model, and modifies the number of divisions to modify the analysis mesh. When the modification is completed, the modified mapping model data 62 and analysis mesh data 63 are registered again in the model database 6.

An analysis mesh modifying method is also described in detail in U.S. Pat. No. 5,892,515.

(3) Change in Geometric Model:

In the preceding section (2), a method of creating an analysis mesh from a geometric model has been explained. Actually, a geometric model is often subjected to partial minor changes due to a model change of a product and a feedback of numerical analysis results. In such a case, rather than newly creating an analysis mesh from the beginning by the method of the preceding section (2), a model database corresponding to an original geometric model (verification model) before a minor change may be utilized to more rapidly and efficiently generate an analysis mesh which is excellent in analysis accuracy.

The user initiates the model verifier 5.

Figure 7:
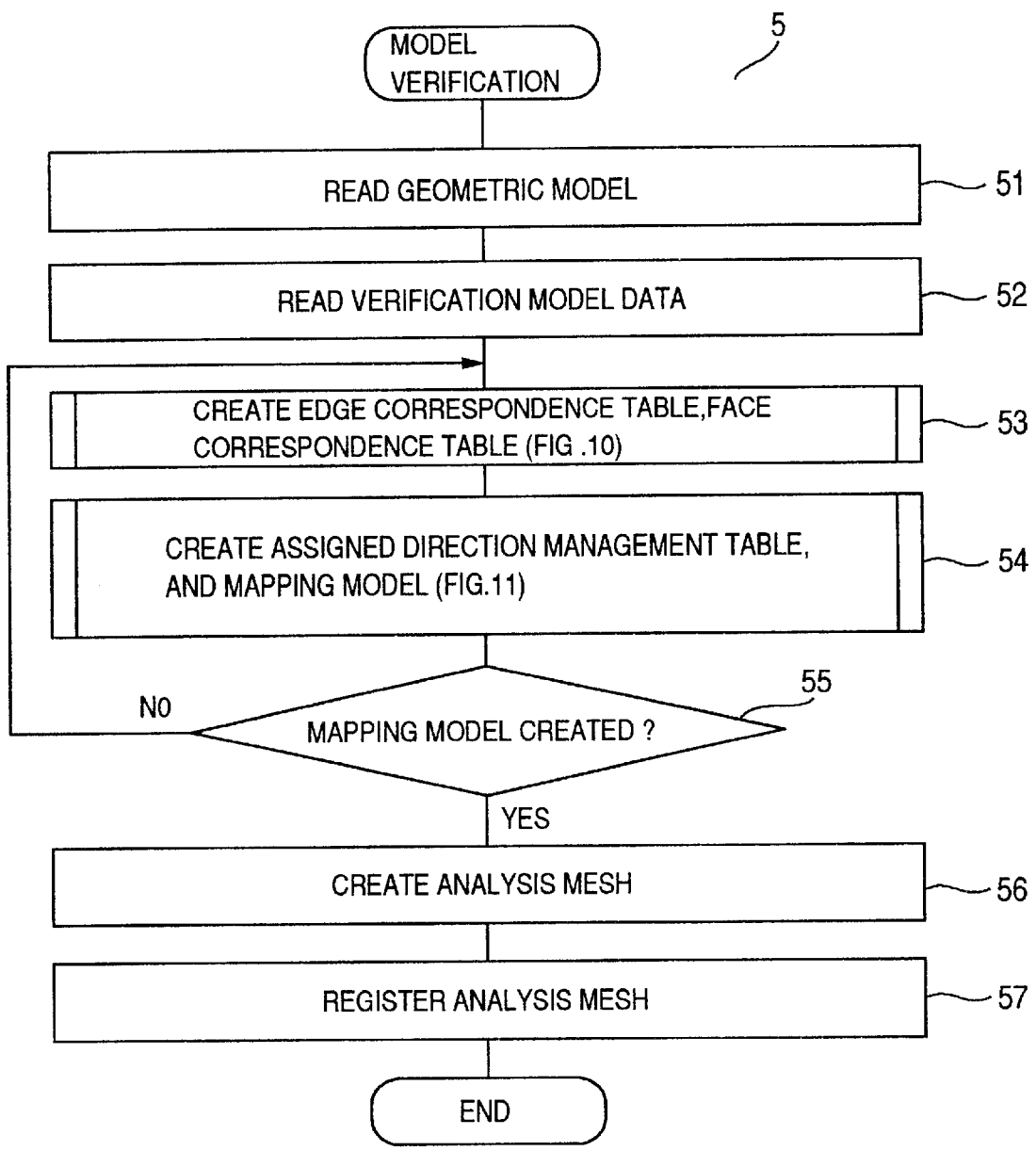
FIG. 7 is a flow chart illustrating a processing procedure for a model verifier to create an analysis mesh.
Figure 8:
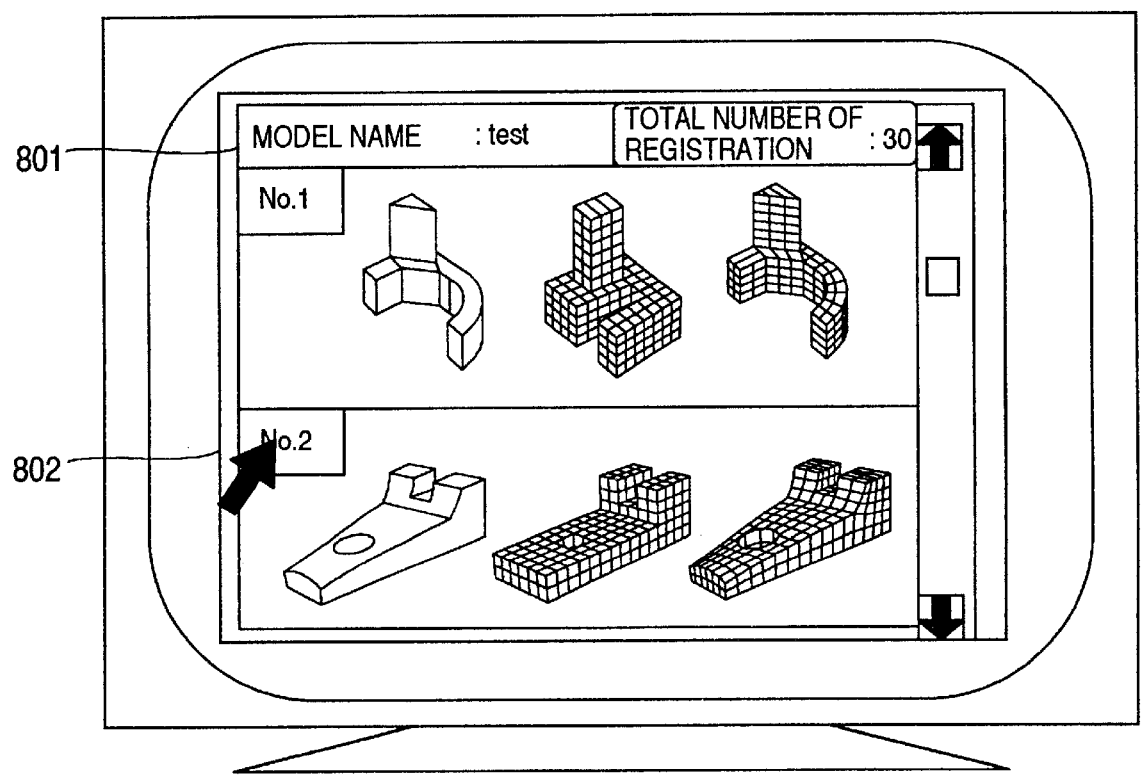
FIG. 8 is a diagram illustrating an example of a model selection screen.

FIG. 7 is a flow chart illustrating an example of a processing procedure for the model verifier 5 to create an analysis mesh, and FIG. 8 is a diagram illustrating an example of a model selection screen.

Step 51: Similarly to step 31 in FIG. 3, the model verifier 5 reads a geometric model under analysis, and registers it in the model database 6 as geometric model data 61. Geometric model data 61 for an original geometric model (verification model) previously registered in the model database 6 may be read such that the user may change the geometry and add a feature using GUI (Graphic User Interface) to create geometric model data for the changed geometric model.

Step 52: The model verifier 5 reads a geometric model for a verification model from the model database in response to an instruction of the user. When a model having a model name similar to a geometric model under analysis exists in the database, this model is selected as a verification model, and displayed on the screen. When a model analogous to a geometric model under analysis has been registered in the model database, the analogous model may be selected as a verification model. In this event, the name of a model to be verified may be inputted in a field 801 for selection using, for example, the model selection screen illustrated in FIG. 8. Alternatively, a geometric model, a mapping model and an analysis mesh registered in the model database may be displayed on the display 1a such that the user of the mesh generating apparatus may select a verification model using a mouse pointer 802 while confirming the model.

Step 53: For corresponding the model under analysis to the verification model in terms of the geometry, the model verifier 5 compares the geometric model data of both, and creates on the main memory an edge correspondence table and a face correspondence table for corresponding edges and faces of both. The structures of the edge correspondence table and the face correspondence table are shown in FIG. 9. Details on the procedure will be described later with reference to FIG. 10. At this time, edges and faces which do not correspond to the verification model may be displayed, for example, in different colors, thus permitting the user of the mesh generating apparatus to determine the presence or absence of the correspondence relationship therebetween.

Step 54: The model verifier 5 generates mapping model data for the model under analysis from the mapping model data 62 for the verification model and the correspondence tables created at step 53. Details will be described later with reference to FIG. 11. When the model verifier 5 fails to generate mapping model data, the user is notified.

Step 55: The user confirms whether or not the mapping model can be created or not. If the mapping model cannot be created, the user instructs to change a method of corresponding the verification model to the model under analysis. The model verifier 5 repeats steps 53, 54 in accordance with the instructed method. On the other hand, if the mapping model can be created, the procedure proceeds to step 56.

Step 56: When the mapping model can be created, an analysis mesh is created on the basis of the created mapping model data in accordance with the boundary fit method.

Step 57: The created analysis mesh is registered in the model database 6 as analysis mesh data 63.

Steps 56, 57 are the same as steps 34, 35 in FIG. 3. Thus, the analysis mesh creator 3 and the model verifier 5 may share a logic associated with these portions.

FIG. 10 is a flow chart illustrating in detail a processing procedure for creating a correspondence table at step 53 in FIG. 7.

A correspondence table creating method depends on how geometric model data are input for a model under analysis, or which part of a model under analysis and a verification model is observed.

In the geometric model data 61, edges and faces constituting the topology information are given unique identifiers (IDs) (or identification numbers). When a model under analysis is created by partially changing geometric model data of a verification model, it is assumed that the user uses the model names relating to each other. For example, a model under analysis created from a verification model "PART 1-A" is "PART 1-B". In this case, geometric model data of "PART 1-A" and "PART 1-B" can be corresponded to each other with identifiers.

Step 531: A program compares the model names of the verification model and the model under analysis to check whether or not they are related to each other. Instead of the program automatically determining from the model names, the user may be queried.

Step 532: When the two models are related, correspondence tables are created on the basis of identifiers of edges and faces in the geometric model data 61 of both models.

Step 533: When the two model are not related, the program analyzes the topology information of both the geometric model data. If they are equal in topology, the procedure proceeds to step 534.

Step 534: The program examines whether or not edges and faces of both correspond to each other.

Step 535: In this event, if the program cannot uniquely determine a correspondence relationship, for example, such that the two hexahedrons are corresponded to each other, the user of the mesh generating apparatus is prompted to specify at least two corresponding edges or faces to uniquely determine the correspondence relationship.

Step 536: When the two models are equal in topology, the program corresponds topologically corresponding edges and faces to each other.

Step 537: When the two models are not equal in topology, the coordinates of the two models are compared to attempt a correspondence. In the two model, local orthogonal coordinate systems and origins are set respectively. Geometric parameters for the geometric model data 61 of both are converted into the set coordinate systems.

Step 538: After corresponding all edges having starting and end points of the same coordinate values in both the model data, the program corresponds faces whose constituent edges have all been corresponded.

When an edge or a face is newly added to a geometric model under analysis, a correspondence relationship between a verification model and the geometric model under analysis cannot be obtained even with the foregoing method. In this case, an identifier "NO RELATION" is entered in a field of the edge correspondence table or the face correspondence table for an edge or a face which cannot obtain the correspondence, for example, as shown in 901 in FIG. 9, to indicate to that effect.

Steps 539, 5391: The user of the mesh generating apparatus can interactively execute changes in correspondence relationship such as addition, deletion and so on for the correspondence relationship set by the mesh generating apparatus.

While in the foregoing example, the identifiers, topology and coordinates are used to correspond two models, and the program determines which of them is used, a technique may be employed to permit the user to specify a correspondence method.

FIG. 11 is a flow chart illustrating in detail a processing procedure for the mapping model creation 54 in the model verifier 5. Explained herein is a method of determining assigned directions for edges and faces, and the number of divisions for edges.

Step 541: A program retrieves the edge correspondence table created by the method of FIG. 10. It also retrieves mapping model data 62 for a verification model and geometric model data 61 for a model under analysis.

Step 542: The program creates an assigned direction management table shown in FIG. 12A from the edge correspondence table and the mapping model data 62 for the verification model retrieved at step 541. The horizontal direction in the table indicates edge numbers, and the vertical direction indicates assigned directions of edges in the mapping model. An edge marked with ○ in the table indicates that this is an edge which has been corresponded to the verification model. In FIG. 12A, edges Nos. 1, 2, 5 are relevant. Here, the direction of the edge marked with ○ is an assigned direction of a corresponding edge in the verification model. An edge marked with Δ in the table indicates that this is an edge which has not been corresponded to the verification model. In FIG. 12A, edges Nos. 3, 4 correspond thereto. For the edges which have not been corresponded, their assigned directions in the mapping model cannot be determined by verification.

Step 543: Since an edge is assigned in either of ± directions along the ξ axis, ± directions along the η axis, and ± directions along the ζ axis in the mapping mode, the program preliminarily decides the assigned direction of edges which are not corresponded in the + direction along ξ axis, as shown in FIG. 12A. Then, each edge is assigned to one direction corresponding to ○ or Δ. A combination of directions marked with ○ or Δ is preliminarily decided as a combination of assigned directions of edges in the mapping model. It is determined whether the preliminarily decided combination of the assigned directions of the edges is logically correct or not in the following manner. From the topology information of the geometric model data 61 of the model under analysis, edges which should constitute a loop or a face are extracted, and examined whether or not the loop is closed to form a face on the mapping model.

Figure 13:
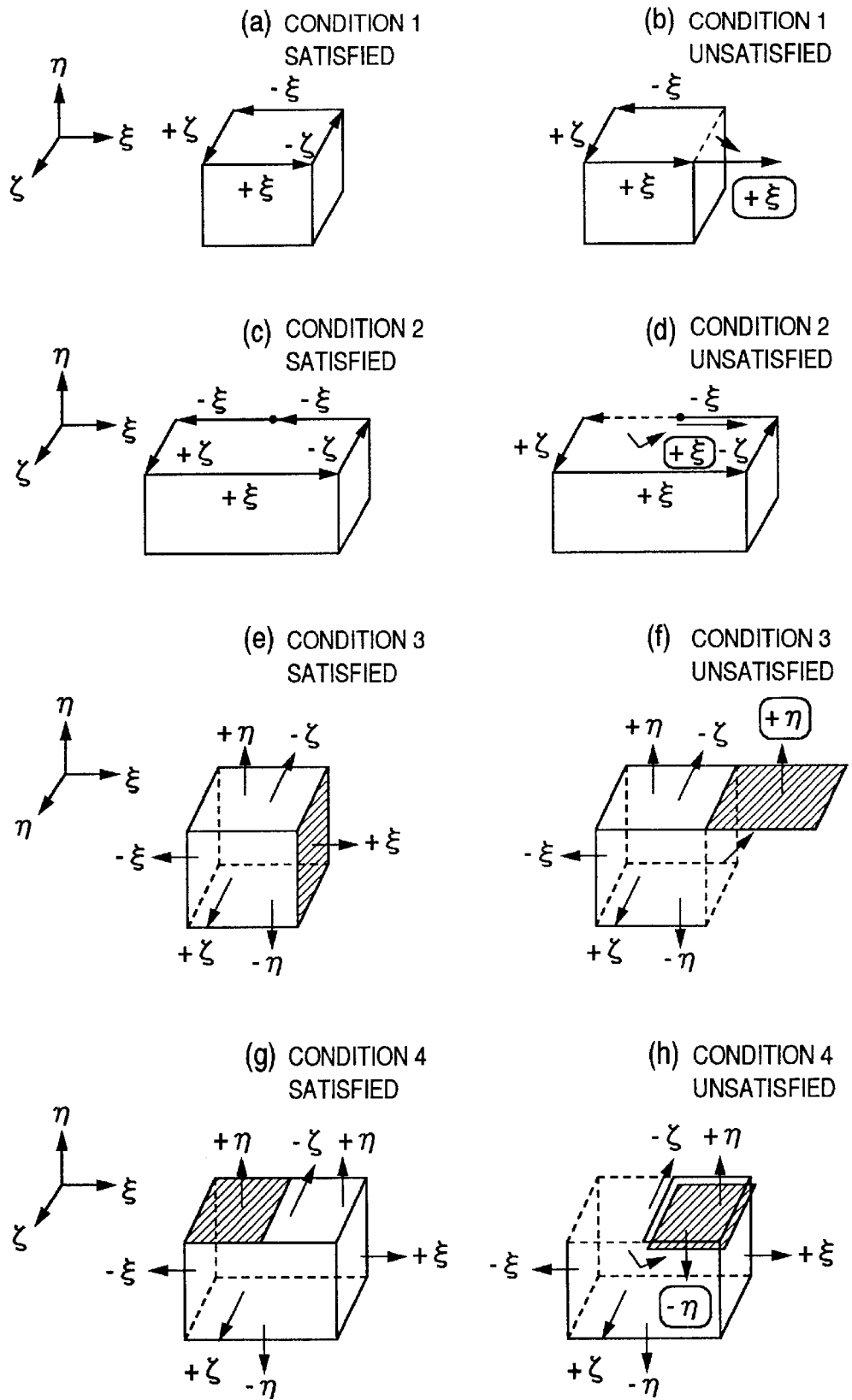
FIG. 13 is a diagram showing examples of successes and failures in satisfying conditions for establishing a mapping model.

It is confirmed whether or not the loop satisfies rules for establishing a mapping model: [Condition 1] when the assigned directions of edges constituting the loop are traced, starting and end points are coincident (step 544), and [Condition 2] any two adjacent edges in the loop are not in the opposite directions along the same axis (step 545). FIG. 13 is a diagram showing examples of successes and failures in satisfying the conditions for establishing a mapping model. Examples of successful and failed establishments of Condition 1, Condition 2 are illustrated in (a) to (d) of FIG. 13.

Step 546: As in the left column of FIG. 13, when the rules are satisfied, the assigned direction of a face is determined on the basis of the assigned direction of edges. The assigned direction of the face is given in the direction of a vector product of two adjacent loop-constituent edges assigned in mutually different axial directions.

Steps 547–549: After determining the assigned directions of all faces, it is determined whether or not a combination of the assigned directions of the faces is logically correct in the following manner. From the topology information of the geometric model data 61 of the model under analysis, faces which should constitute a closed space or a solid are extracted, and determined whether or not they constitute a closed space on the mapping model.

It is confirmed whether or not the faces satisfy rules for establishing a mapping model: [Condition 3] at least one each of faces respectively assigned in the positive and negative directions along the three coordinate axes exists within a solid (step 547); and [Condition 4] any two adjacent faces within the solid are not in the opposite directions along the same axis (step 548). Examples of successes and failures in satisfying Condition 3 and Condition 4 are illustrated in (e) to (h) of FIG. 13. When satisfying the rules, the combination of the assigned directions of the preliminarily decided edges and faces is registered in the model database 6 as mapping model data 62.

Step 5491: Subsequently, the program determines the number of divisions based on the standard element dimension of the verification model so as to maintain connections between the edges of the geometry, and registers it in the model database.

Step 5492: If any of the foregoing four rules is not satisfied, it is checked whether or not all combinations of the assigned directions of the edges have been confirmed. When all combinations have not been confirmed, the program returns to step 543 to change the assigned directions of the edges. In this event, the positions of Δ are changed one by one in order from the smallest edge number as shown in FIG. 12B, to confirm whether or not the rules are satisfied for all combinations.

With the foregoing procedure, the analysis mesh for the changed model can be generated by re-using the data previously created in the verification model.

(4) User Interface Examples:

Next, several exemplary interfaces between the user and the mesh generating apparatus are shown.

Figure 14:
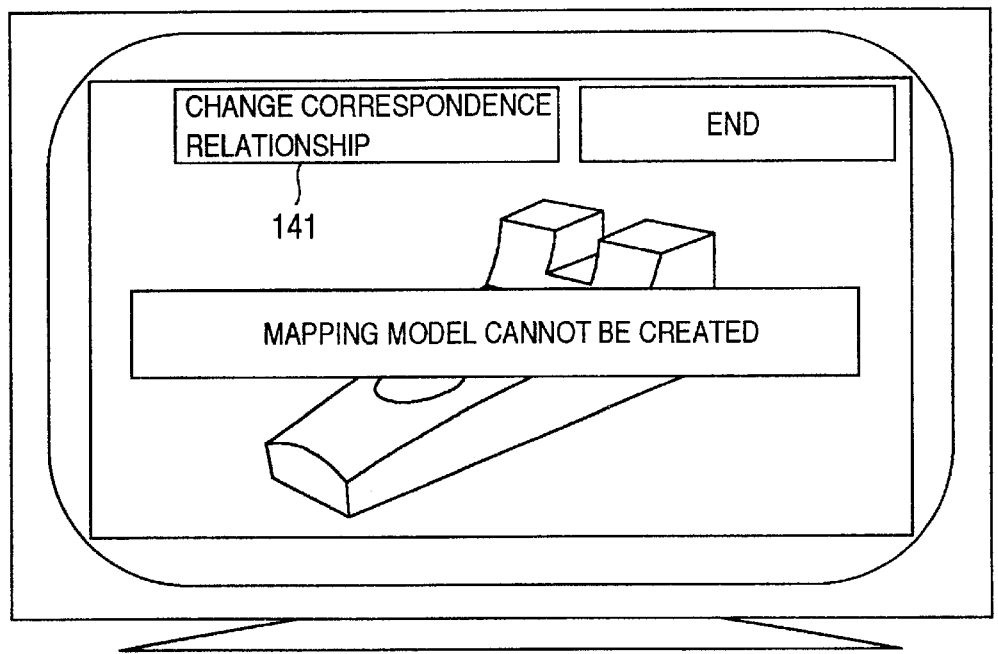
FIG. 14 is a diagram illustrating an example of a comment displayed when the model verifier has failed to create a mapping model.

FIG. 14 is a diagram illustrating an example of a comment displayed when the model verifier has failed to create a mapping model (step 55, No in FIG. 7). When a mapping model cannot be created, a message as shown in FIG. 14 is displayed to notify the user of the mesh generating apparatus. In this event, the user may select a button 141 to again create an edge correspondence table and a face correspondence table using different relationships (ID or topology or coordinates), and return to step 53 to change the correspondence relationship.

Figure 15:
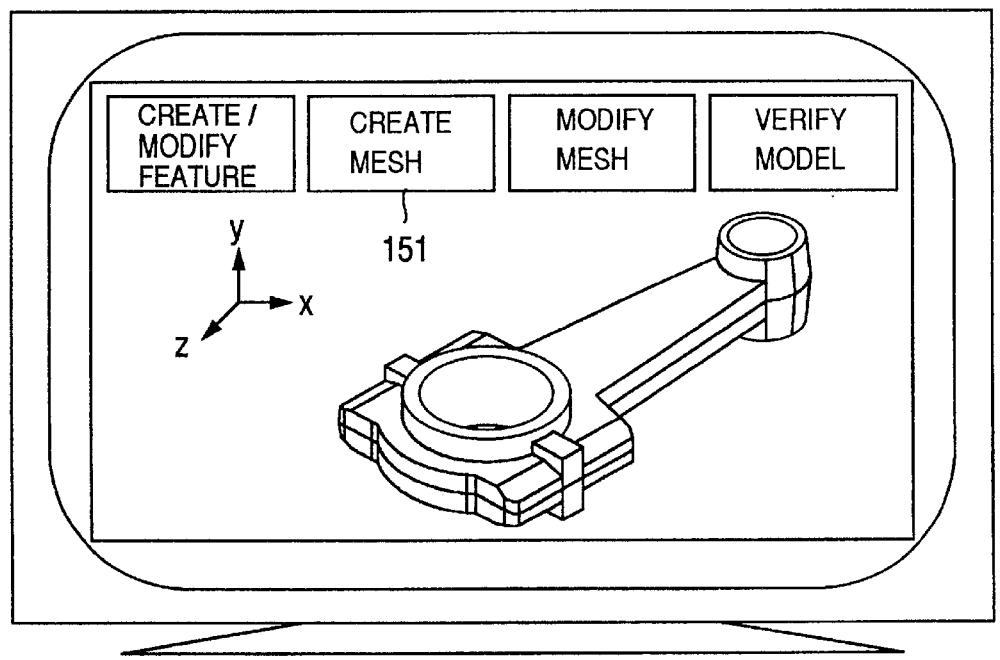
FIG. 15 is a diagram illustrating an example of a geometric model registered in a model database.
Figure 16:
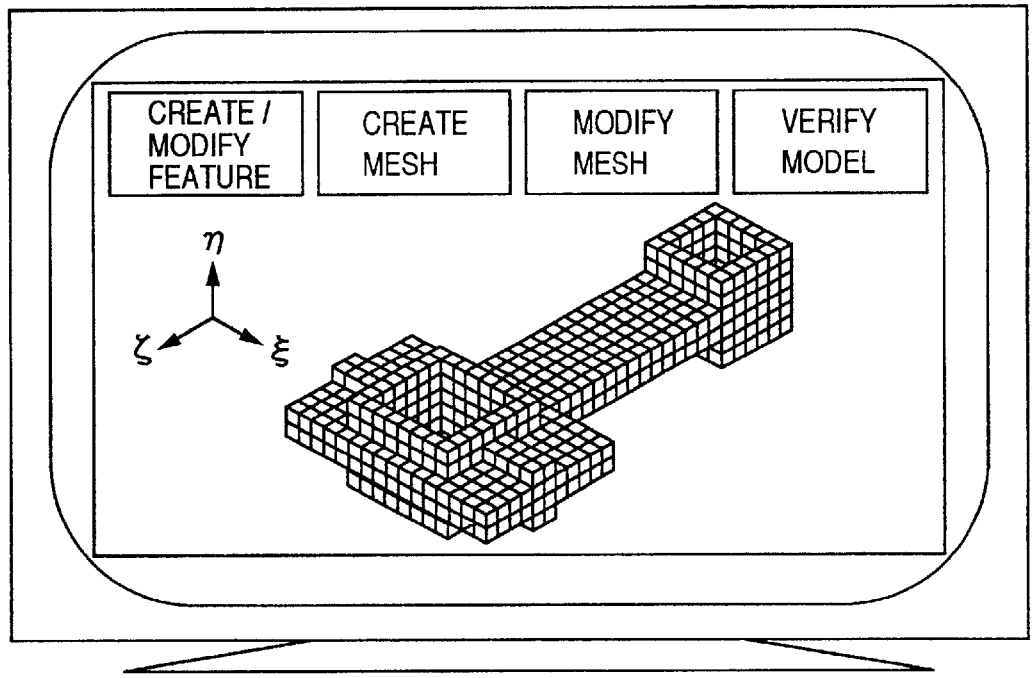
FIG. 16 is a diagram illustrating another example of a mapping model registered in the model database.
Figure 17:
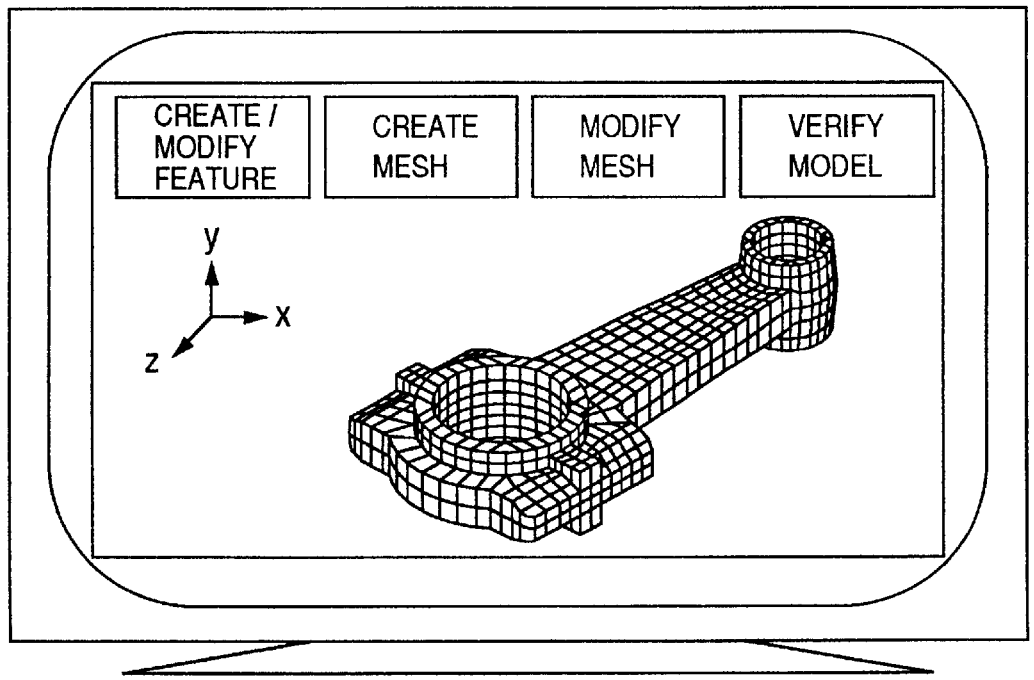
FIG. 17 is a diagram illustrating an example of an analysis mesh registered in the model database.

FIG. 15 is a diagram illustrating an example of a geometric model registered in the model database, FIG. 16 is a diagram illustrating another example of a mapping model registered in the model database, and FIG. 17 is a diagram illustrating an example of an analysis mesh registered in the model database.

Next explained will be an analysis mesh generation process executed when the user initiates the model verifier 5 to change features in the geometric model of FIG. 15 while referencing examples of displayed screens. Assume that an analysis mesh illustrated in FIG. 17 has been created and registered in the model database. Assume also that in this changing of a feature, the changed model has a name which suggests the relation between the geometers of both models.

Figure 18:
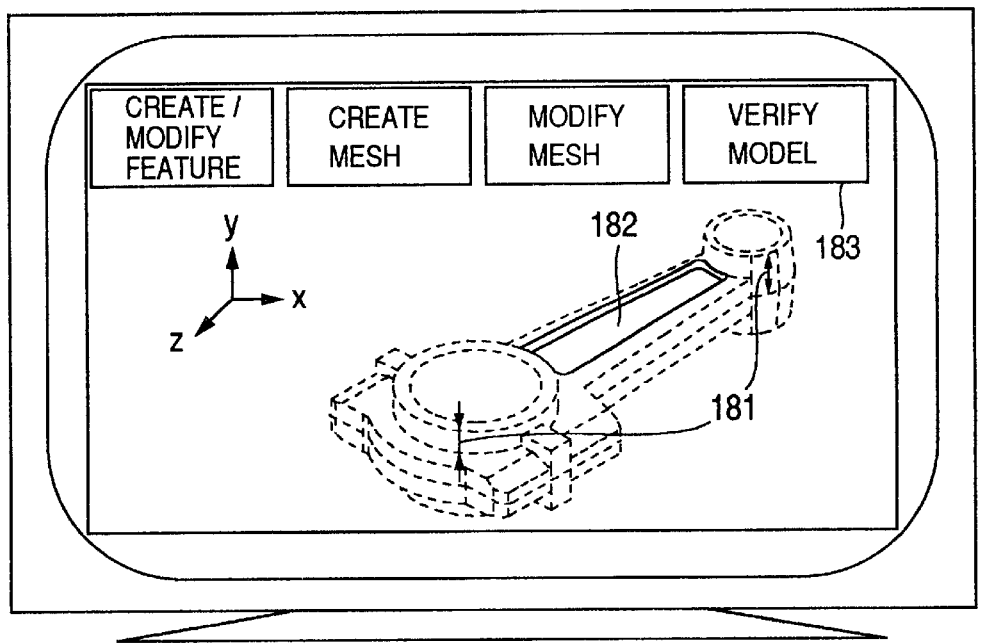
FIG. 18 is a diagram illustrating an example of a geometric model under analysis after a feature in the geometric model of FIG. 15 has been changed.

FIG. 18 shows that features in the geometric model of FIG. 15 has been changed. With the geometric model of FIG. 15 as a starting point, assume that dimensions are changed for portions 181, and a recess is added in a portion 182 in FIG. 18.

The user will verify original model data to create an analysis mesh. As the user of the mesh generating apparatus selects a button 183, the model verifier 5 in FIG. 1 is initiated. The mesh generating apparatus searches the model database 6 to see whether data having the similar model name as the model name of the geometric model under analysis has been registered therein. In this event, since the original model has been registered, the geometric model of FIG. 15 and the mapping model of FIG. 16 are read from the model database 6 as verification models.

Figure 19:
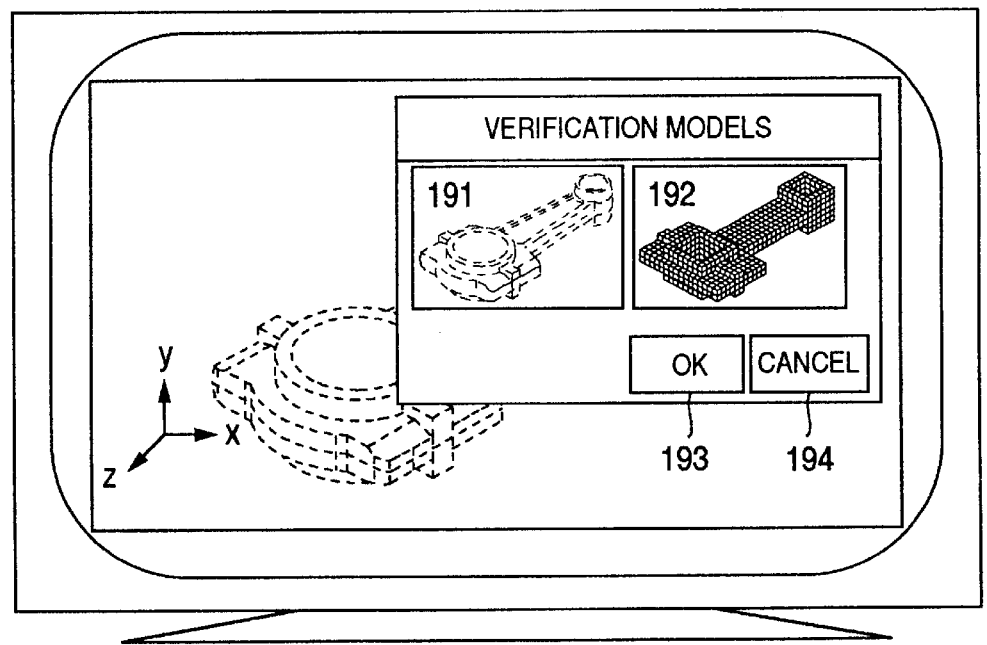
FIG. 19 is a diagram illustrating an example of a display of the model verifier.

FIG. 19 is a diagram illustrating an example of a display of the model verifier. A verification geometric model 191 and a verification mapping model 192 illustrated in FIG. 19 are displayed on the same screen. While only a geometric model and a mapping model are displayed herein as verification models, an analysis mesh may also be displayed together. For verifying this model, a button 193 is selected. For cancellation, a button 194 is selected to proceed to the model selection screen illustrated in FIG. 8.

After the selection of the button 193, the model verifier 5 creates a correspondence table. In this event, the identifiers of edges/faces are compared between the geometric model under analysis and the verification geometric model, to create a correspondence table, and to determine assigned directions of edges and the number of divisions as well as assigned directions of faces in the mapping model.

Figure 20:
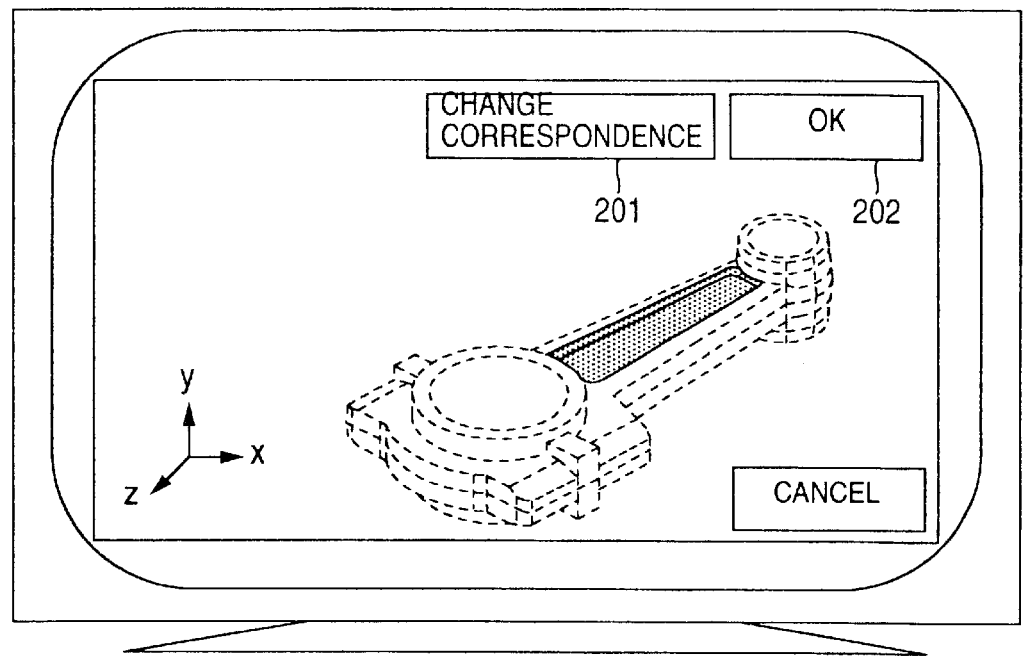
FIG. 20 is a diagram illustrating an example of a displayed geometric model after model verification.

FIG. 20 is a diagram illustrating an example of a displayed geometric model after the model verification. With respect to edges/faces of the newly added recess portion 182 in FIG. 18, corresponding edges and faces do not exist in the reference model, so that "NO RELATION" is described in the correspondence table. On the screen of FIG. 20, the no-relation part is displayed in a different color or the like so that the user of the mesh generating apparatus can discriminate. Here, if the user of the mesh generating apparatus wants to change the correspondence relationship, a button 201 is selected (step 539 in FIG. 10).

Figure 21:
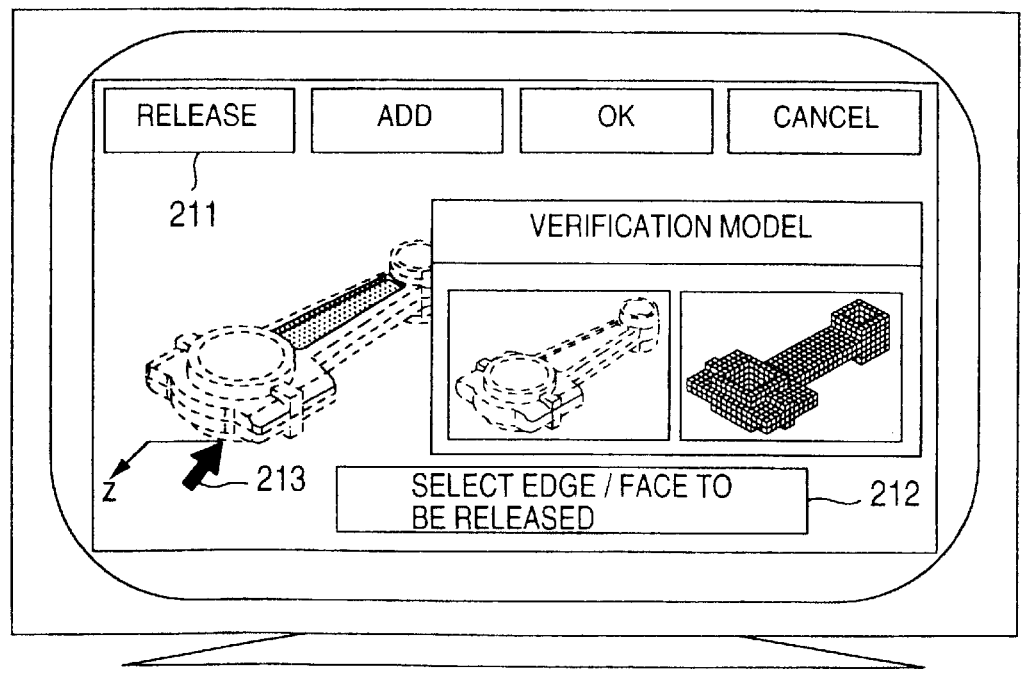
FIG. 21 is a diagram illustrating an example of a displayed screen when a correspondence relationship is released.

FIG. 21 is a diagram illustrating an example of a displayed screen when a correspondence relationship is released. When the correspondence relationship is released, the geometric model under analysis and the verification model are displayed on the same screen, as illustrated in FIG. 21. When the correspondence relationship is released herein, a button 211 is selected. In response, a comment 212 and a mouse pointer 213 are displayed. When the user of the mesh generating apparatus moves the pointer 213 to select an edge or a face to be released, the model verifier 5 displays the corresponding edge or face in the verification model in different colors or the like. Therefore, the user of the mesh generating apparatus readily understands which edge or face in the verification model it is corresponded to.

Figure 22:
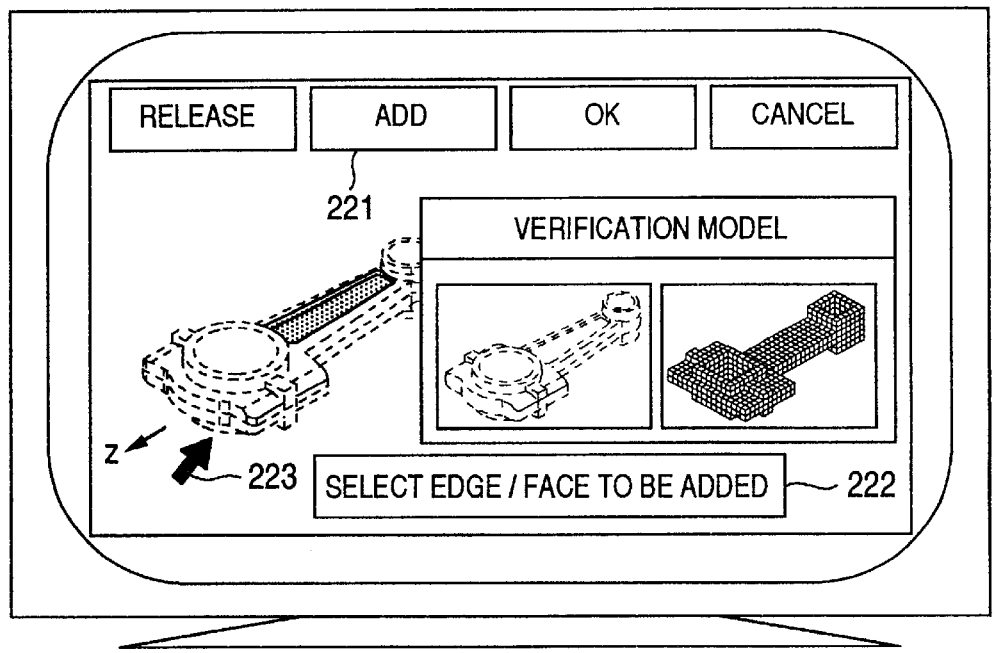
FIG. 22 is a diagram illustrating an example of a displayed screen when a correspondence relationship is added.

FIG. 22 is a diagram illustrating an example of a displayed screen when a correspondence relationship is added. When a correspondence relationship is added, a button 221 is selected (step 539 in FIG. 10). In response, a comment 222 and a mouse pointer 223 are displayed. The user of the mesh generating apparatus, after moving the pointer 223 to select an edge or a face in a geometric model under analysis for which a correspondence relationship is to be added, specifies an edge or a face in a verification model to which the selected edge or face is to be corresponded, and corresponds them. Assume herein that no release or addition of a correspondence relationship has been made.

Subsequently, for edges/faces for which correspondent relationship cannot be obtained, the mesh generating apparatus determines assigned directions and the number of divisions.

Figure 23:
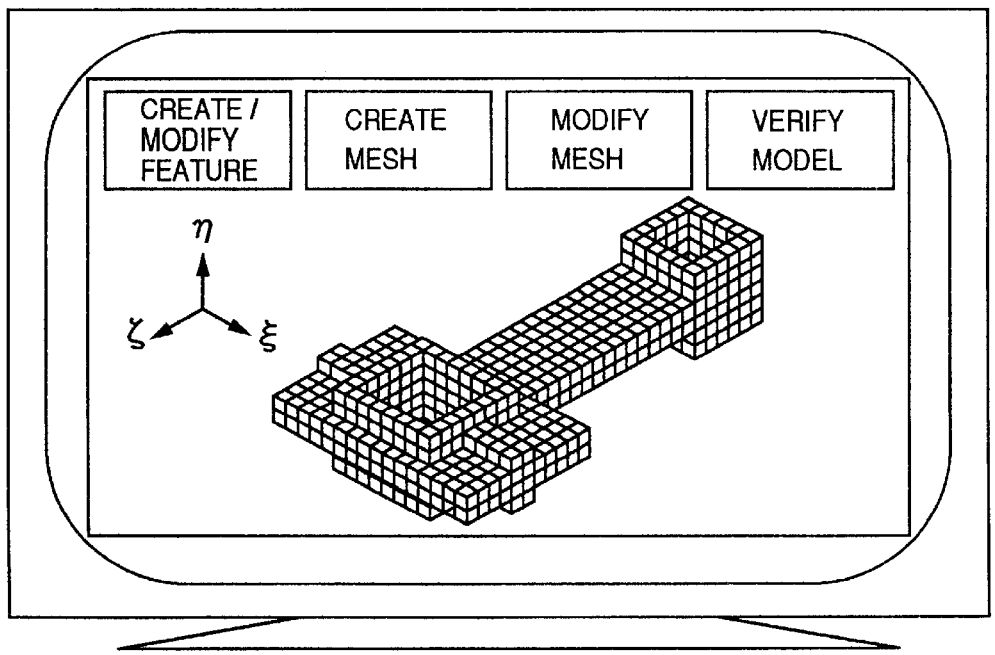
FIG. 23 is a diagram illustrating an example of a mapping model created by the model verifier.

FIG. 23 is a diagram illustrating an example of a mapping model created by the model verifier 5. In a mapping model of FIG. 23, the assigned directions and the number of divisions for edges shown in bold lines in the mapping model, and the assigned direction of the face surrounded by the edges are portions determined by the mesh generating apparatus, which are displayed in different colors or the like such that the user of the mesh generating apparatus readily finds them.

Figure 24:
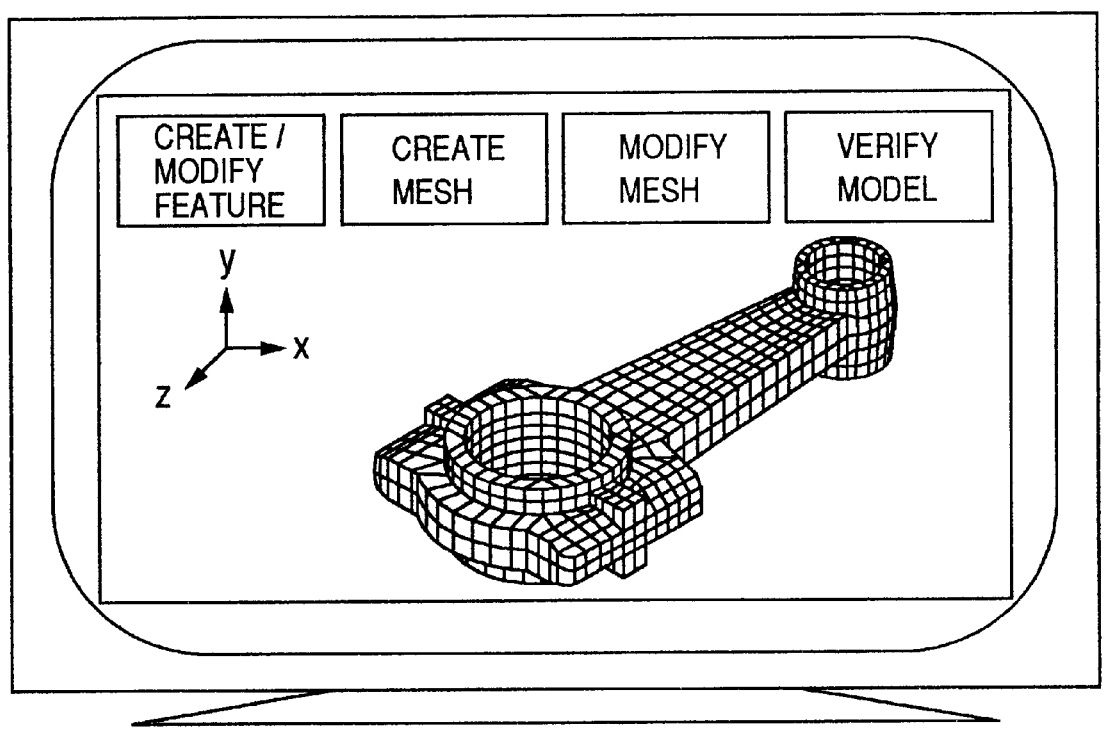
FIG. 24 is a diagram illustrating an example of an analysis mesh created on the basis of the mapping model of FIG. 23.

FIG. 24 is a diagram illustrating an example of an analysis mesh created on the basis of the mapping model of FIG. 23. The created analysis mesh is registered in the model database 6. Subsequently, when a feature in the mapping model is changed, the mesh geometry can be further modified.

What is claimed is:

1. A numerical analysis mesh generating method comprising the steps of:

inputting a geometric model under analysis;

selecting a verification model having a geometry analogous to said geometric model, wherein said verification model includes a geometric model and a previously created mapping model which is approximated from the geometric model with a lattice;

corresponding said geometric model under analysis to the geometric model of said verification model in terms of the geometry;

reading the previously created mapping model of said verification model;

creating a mapping model for said geometric model under analysis by generating a part of said mapping model using data of said previously created mapping model, said data being available to create said mapping model, and by newly generating a remaining part of said mapping model; and mapping lattice points of said created mapping model to said geometric model under analysis to create a numerical analysis mesh.

2. A numerical analysis mesh generating method according to claim 1, wherein in said step of corresponding said geometric model under analysis to said verification model in terms of the geometry, edges of both said models are corresponded.

3. A numerical analysis mesh generating method according to claim 2, wherein for portions which cannot be corresponded in said step of corresponding the geometries, newly adding edges and faces to said mapping model of said verification model is performed in said mapping model creating step.

4. A numerical analysis mesh generating method according to claim 2, wherein in said step of corresponding said geometric model under analysis to said verification model in terms of the geometry, both said models are corresponded with identifiers given to edges thereof.

5. A numerical analysis mesh generating method according to claim 2, wherein in said step of corresponding said geometric model under analysis to said verification model in terms of the geometry, both said models are corresponded with topologies thereof.

6. A numerical analysis mesh generating method according to claim 2, wherein in said step of corresponding said geometric model under analysis to said verification model in terms of the geometry, both said models are corresponded with coordinates thereof.

7. A numerical analysis mesh generating apparatus comprising:

geometric model input means for inputting a geometric model under analysis for registration in a storage device;

mapping model creating means for creating a mapping model by approximating said geometric model with a lattice for registration in the storage device; and model verifying means for selecting a verification model stored in the storage device, said verification model having a geometry analogous to the inputted geometric model, wherein said verification model includes a geometric model and a previously created mapping model which is approximated from the geometric model with a lattice, corresponding said geometric model under analysis to the geometric model of said verification model in terms of the geometry, reading the previously created mapping model of said verification model from the storage device, creating a mapping model for said geometric model under analysis by generating a part of said mapping model using data of said previously created mapping model, said data being available to create said mapping model, by newly generating a remaining part of said mapping model, and mapping lattice points in said created mapping model to said geometric model under analysis to create a numerical analysis mesh.

8. A numerical analysis mesh generating program for executing the steps of:

inputting a geometric model under analysis;

selecting a verification model having a geometry analogous to said geometric model, wherein said verification model includes a geometric model and a previously created mapping model which is approximated from the geometric model with a lattice;

corresponding said geometric model under analysis to the geometric model of said verification model in terms of the geometry;

reading the previously created mapping model of said verification model;

creating a mapping model for said geometric model under analysis by generating a part of said mapping model using data of said previously created mapping model, said data being available to create said mapping model, and by newly generating a remaining part of said mapping model;

mapping lattice points in said created mapping model to said geometric model under analysis to create a numerical analysis mesh.

* * * * *

UNITED STATES PATENT AND TRADEMARK OFFICE
CERTIFICATE OF CORRECTION

PATENT NO. : 6,727,898 B2
DATED : April 27, 2004
INVENTOR(S) : Hariya et al.

It is certified that error appears in the above-identified patent and that said Letters Patent is hereby corrected as shown below:

Title page,
Item [30], Foreign Application Priority Data, insert:

-- Nov. 18, 1998      (JP) .............. 10-328634 --.

Signed and Sealed this

Twenty-eighth Day of September, 2004

JON W. DUDAS
*Director of the United States Patent and Trademark Office*